United States Patent [19]

Collins et al.

[11] Patent Number: 4,904,866
[45] Date of Patent: Feb. 27, 1990

[54] WIDE AREA SOFT VACUUM ABNORMAL GLOW ELECTRON BEAM DISCHARGE HARDENING PROCESS

[75] Inventors: George J. Collins, Ft. Collins, Colo.; Jayaram Krishnaswamy, Raleigh, N.C.

[73] Assignee: Applied Electron Corporation, Santa Clara, Calif.

[21] Appl. No.: 272,641

[22] Filed: Nov. 17, 1988

[51] Int. Cl.$^4$ .............................................. H01J 37/30
[52] U.S. Cl. ............................. 250/492.2; 250/492.3; 250/423 R
[58] Field of Search ............ 250/492.3, 492.2, 492.21, 250/398; 313/363.1, 362.1, 619; 315/111.31, 111.81

[56] References Cited

U.S. PATENT DOCUMENTS

| | | | |
|---|---|---|---|
| 4,187,331 | 2/1980 | Hsioh-Lien Ma | 430/328 |
| 4,496,449 | 1/1985 | Rocca et al. | 250/492.3 |
| 4,527,044 | 7/1985 | Bruel et al. | 250/492.3 |
| 4,737,688 | 4/1988 | Collins et al. | 313/362.1 |
| 4,827,137 | 5/1989 | Collins et al. | 250/492.2 |
| 4,849,628 | 7/1989 | McLuckey et al. | 250/423 R |

Primary Examiner—Janice A. Howell
Assistant Examiner—Kiet T. Nguyen
Attorney, Agent, or Firm—William E. Hein

[57] ABSTRACT

A process for large area hardening of photoresists or polymer films placed on substrates is disclosed. The process requires the use of a short duration (<1 us.) pulsed electron beam produced in soft vacuum by an abnormal glow discharge. The pulsed electron beam interacts with the patterned photoresist/polymer resist so as to harden or stabilize the patterns thereon by electron induced cross-linking. The use of a soft vacuum environment allows for both thermal as well as chemically induced hardening.

17 Claims, 2 Drawing Sheets

WIDE AREA SOFT VACUUM ABNORMAL GLOW ELECTRON BEAM DISCHARGE HARDENING PROCESS

REFERENCE TO RELATED APPLICATION AND PATENT

This application is related to the subject matter of U.S. patent application Ser. No. 856,950 entitled Soft Vacuum Electron Beam Patterning Apparatus and Process filed Apr. 28, 1986, by George J. Collins and Jayaram Krishnaswamy, and to U.S. Pat. No. 4,496,449 entitled Electron Beam Etching of Integrated Circuit Structures. The subject matter of the foregoing application and patent is incorporated herein by reference.

BACKGROUND OF THE INVENTION

The present invention relates generally to the hardening of polymer thin films and more specifically to the hardening of patterned photoresist used in microelectronics, flat panel displays, and optoelectronics processing. Both latent images, as well as resist relief patterns, formed in an earlier lithographic process need to be protected from subsequent high temperature processing which causes reflow of resist and results in loss of pattern fidelity. This high temperature processing occurs intentionally as a consequence of a subsequent process step. During this subsequent process step, depending on the chemistry of the resist, and the temperature-time cycle to which it is subjected, the resist relief pattern itself or the latent images contained therein flow, altering or destroying the pattern integrity of the first layer. Examples of this subsequent process step include hard baking of patterned resist or resists with latent images, dry etching or reactive ion etching, high temperature sputtering, ion implantation, and lift-off process steps. Each of these process steps has a unique temperature-time cycle associated with it and may cause undesired reflow of the original underlying resist.

Uniformity both across the planar area of the resist film and versus depth into the resist film are lacking in prior art resist hardening methods. Ultraviolet (UV) photohardening of resists has been proposed in the prior art where the chemistry of the resist is changed by absorption in the resist of UV or vacuum ultraviolet (VUV) radiation. In the UV photohardening prior art, (H. Hiraoka and J. Pacansky, J. Electrochemical Soc., 128, 2645, 1981) it is known to use 250 nm photons to thermophysically harden AZ-type photoresists through a photo-oxidation hardening mechanism. UV photohardening, while practical for treating thin resist layers is not suitable for hardening thick layers in a uniform fashion across the planar area of the resist, as described above, and especially versus depth into the resist. The optical extinction coefficient of most organic resist constituents is around $1.0 \times 10^4$ liter/molcm, and 95% of the ultraviolet energy from the lamp is absorbed within 3000 Angstroms of the surface. Hence, for thick resists non-uniform exposure occurs versus depth when using photons to harden the resist. The exposure time and deposited energy required to harden using photons are also considerable. Finally, to produce the required UV energy at a wavelength around 250-300 nm., from a conventional UV lamp, the input electrical energy needed is large since the UV energy/electrical power conversion ratio in conventional UV lamps is typically $10^{-3}$. Hence, a 1-watt photon output may require kilowatts of input electrical power. The typical operating life of these lamps is limited to around 1000 hours, and they require external cooling during their operation.

Plasma hardening schemes such as PRIST (Plasma Resist Image Stabilization Technique, W.H.-L. Ma, U.S. Pat. No. 3,920,483) have been proposed in the prior art. In these techniques the chemistry of the resist is modified by bombardment of the resist by reactive and charged species produced in the plasma. Plasma hardening of resist is also limited to shallow depths. A 1-kilovolt electron can, for example, penetrate a typical resist to a depth of less than 0.03 um, and an ion with a similar energy can penetrate the resist even less. However, electrons and ions produced in a typical plasma possess energies typically less than 100 volts and hence are ineffectual in hardening uniformly any but the thinnest top layer. Further, there is the problem of distortion or shift of the geometrical pattern during the plasma hardening process, which should be minimized.

Ion beam hardening, still in the research stage, is also depth limited even at 100 kV ion energy due to the shallow ion penetration depth into polymer films. This depth is about 1 micrometer, depending on the type and energy of the ions, as illustrated in the table below, which shows illustrative data for gallium (heavy) and hydrogen (light) ions. See H. Ryssel, K. Haberger, and H. Krantz, J. Vac. Sci. Technology 19(4)m 1358 (1981); R. L. Selliger and H. Krantz, Electronics p. 142, (1980); and 1. Adesida, C. Anderson, and E. D. Wolf, J. Vac. Sci. Technology 1, 1182 (1983). Ions, if they do penetrate, can damage the underlying substrate due to their large mass.

TABLE 1

| ION | ION ENERGY (kV) | PENETRATION DEPTH (um) |
|---|---|---|
| +Ga | 40 | 0.046 |
|  | 55 | 0.060 |
|  | 120 | 0.120 |
| +H | 40 | 0.52 |
|  | 100 | 1.08 |
|  | 120 | 1.12 |

In summary, the problems with flood exposure of photoresist with ion beams include radiation damage of the underlying substrate for thin resist films, non-uniformity of exposure over wide areas, depth non-uniformity, excessive resist heating and/or excessive resist crosslinking making resist stripping more difficult. All of the above lead to loss of process reliability.

High energy electron beam resist hardening systems have the advantage of deeper penetrating power of the energetic electrons, compared to ions, into the resist, for a given accelerating voltage, allowing for more uniform exposure versus depth. Empirically, the depth of electron penetration, R (in microns), into the polymer film is related to the density of the polymer and the incident electron energy through the equation $R = 0.046 V^{1.7}/d$, where V is the energy of the beam in kilovolts, and d is the density of the resist in gms/cc. See A. Novembre and T. N. Bowmer, Materials for Microlithography, Chap. 11, p. 241; and C. G. Wilson, L. F. Thomson and J. M. J. Frechet, ACS Symposium Series, 266, Washington, C.C. (1984). Note that polymer resists with a density around 1.2 grams/cc. can be penetrated to a depth of 11 um. by 25 kilovolt electrons, allowing for very uniform depthwise polymer exposure over at least 5 microns. A second major advantage of electron beam hardening is the ability to produce very spatially uniform electron beams over very wide areas, as described below for non-thermionic electron sources. Despite the basic advantages listed above, a conventional electron beam hardening system has several practical disadvantages, as presently practiced, that have restricted its use to date.

One disadvantage of prior art electron beam hardening systems is that they use a hot filament source for electron emission and therefore require operation in high vacuum ($10^{-6}$ to $10^{-4}$ Torr conditions) or the filament will be destroyed. The photoresist electron beam hardening process, especially when practiced over wide areas, produces vapors which will poison the thermionic electron emission process. In addition to catastrophic poisoning, the vapors in small quantities substantially reduce the operating life of the filament to unacceptable levels. Another disadvantage of thermionic electron beam systems is that the electron dose needed to harden a typical resist of 3 um. thickness could be as much as 600 to 1000 uc/cm.$^2$, which is equivalent to a one minute exposure of a beam with a current density of more than 1 mA/cm.$^2$ A beam with lower current density would take a correspondingly longer processing time. For hardening large surface areas, a large area electron beam would be needed and keeping filament temperature constant over a large area is by no means easy. Finally, thermionic electron sources have difficulty in providing wide area electron beams with intensity uniformity less than plus or minus 5%. As a consequence, beam uniformity and beam brightness become problematic for hot filament wide area electron sources.

In summary, the prior art resist or polymer hardening processes are limited to hardening thin (0.1 to 1 micron) layers of the polymer or resist which is clearly insufficient for the thicknesses envisaged in many technological applications including packaging lithography. Furthermore, uniformity of hardening both across the wafer and through the depth of the patterned resist are unresolved issues in prior art methods.

SUMMARY OF THE INVENTION

The present invention addresses the issues of depth of hardening and uniformity of hardening over wide areas and provides a cost effective, simple alternative to prior art processes. As opposed to the thermionic electron beam hardening process as presently practiced, the present invention stipulates the use of a very short duration, pulsed electron beam produced in soft vacuum in a 0.001 to 1 Torr gaseous environment by an abnormal glow discharge. Using abnormal glow discharge electron beam generation, large area (>100 sq. centimeters) and high peak flux (>10 A/sq. centimeters) electron beams can be produced. These soft vacuum electron beams possess excellent spatial uniformity (plus or minus 1% over 10 cm. diameters) and a high degree of collimation. Beams are generated at high (40-80 percent) efficiency. The beneficial gas phase surface chemistry of the soft vacuum gas phase interaction of the electron beam with the polymer or resist film during electron irradiation is utilized in some cases. It is noteworthy that the soft vacuum (0.001 to 1 Torr) environment required in the present hardening process is both simple and inexpensive to produce.

DESCRIPTION OF THE PREFERRED EMBODIMENT

Figure 1:
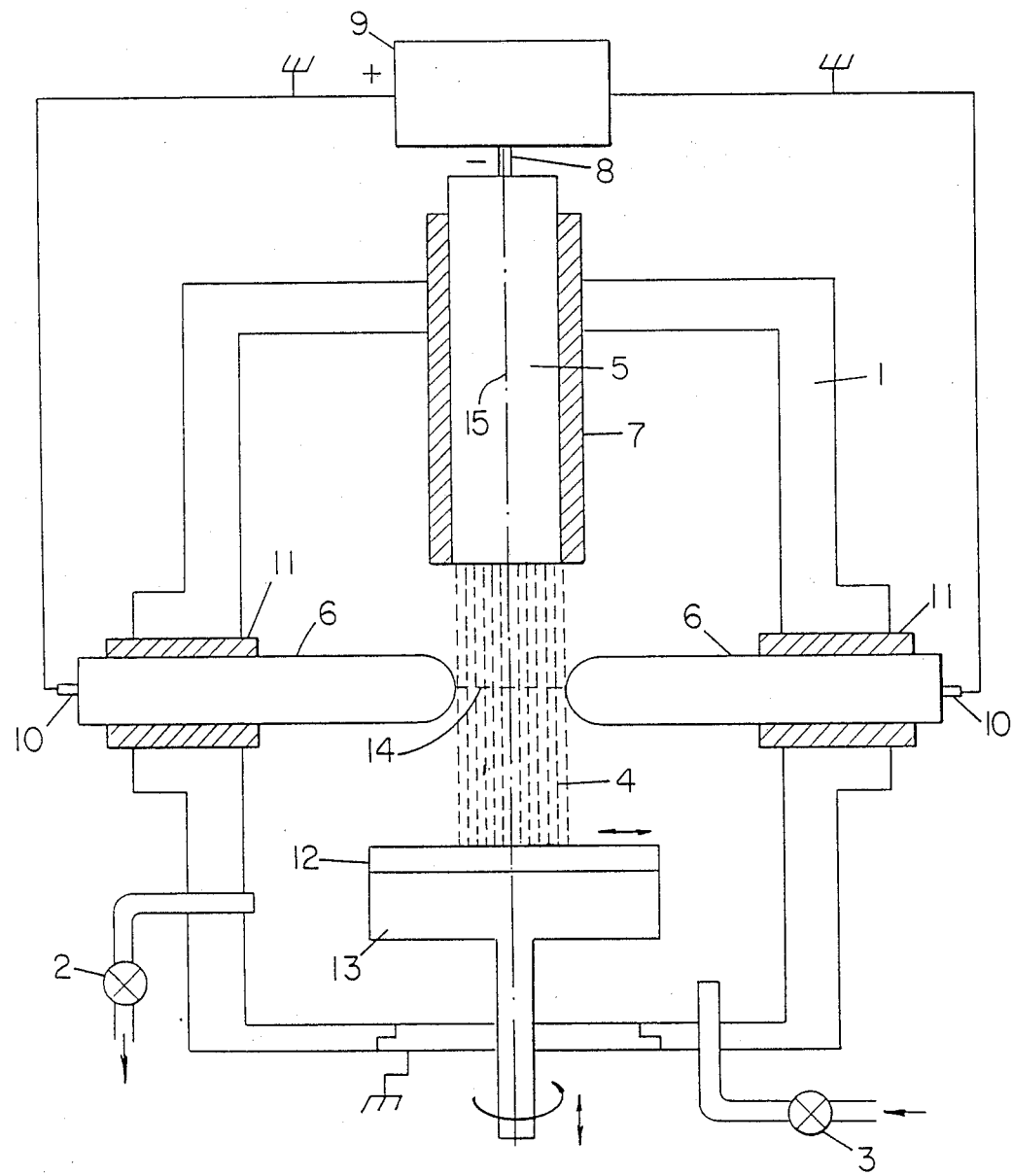
FIG. 1 is a schematic diagram of the resist hardening apparatus of the present invention.

Referring now to FIG. 1, pulsed electron beam hardening of the patterned photoresist, thin film or polymer resist layer takes place in a vacuum vessel 1 which is evacuated through a vacuum valve 2. For reasons of electrical safety, the vacuum vessel is maintained at ground potential. The vacuum vessel 1 is placed at an ambient working pressure in the range of 1 mTorr to 1 Torr by bleeding in a gas or a combination of gases through valve 3.

Figure 2:
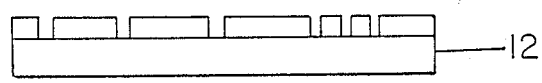
FIG. 2 is an illustration of the patterned resist layer on a substrate.

The electron flood beam 4 is produced in a pulsed, abnormal glow discharge between the front face of a cylindrical cold cathode 5 and an annular anode 6. The sides of the cold cathode 5 are prevented from participating in the discharge by an insulating sleeve 7. The cold cathode 5 has a terminal 8 to which the negative end of the pulsed high voltage source 9 may be connected to produce the discharge. The positive side of the high voltage source 9 is connected to the terminal 10 of the anode 6. Anode 6 is electrically insulated by a conventional standoff structure 11 from the vacuum vessel 1. The preferred location of the substrate 12 having a patterned resist layer thereon is so as to face the front face of cold cathode 5 beyond the annular opening in the anode 6 as shown in FIG. 1. The patterned resist or polymer layer on a substrate 12 which needs to be hardened, as illustrated in FIG. 2, is placed on an X-Y-Z-theta stage 13 which is movable in the X-Y directions as well as in the Z direction to position it closer to or further from the cold cathode 5. The centers of the X-Y-Z-theta stage 13 in its undisplaced position, the anode ring 6, and the cold cathode 5, are collinear, thereby establishing the center of symmetry 15 of the apparatus.

A fine metal wire mesh 14 covers the opening in the anode 6 through which the electron beam 4 is transmitted from the cold cathode 5 to the patterned resist layer on substrate 12. The purpose of this wire mesh 14 is to physically filter any large sputtered particle that may be produced in the cathode-anode region from reaching the substrate.

Referring further to FIG. 1, there is shown a cylindrical cold cathode 5 held in an insulating sleeve 7 and connected to one terminal 8 of a high voltage pulse source 9. The chosen peak voltage of pulse source 9 is determined by the given thickness of the resist to be hardened using the available electron beam penetration depth data base. The cold cathode 5 with its associated insulating sleeve 7 is attached to one end of a vacuum chamber 1. The substrate with the patterned resist layer to be hardened, as illustrated in FIG. 2, is mounted on the X-Y-Z-theta stage 13 and attached to the other end of the vacuum chamber 1 opposite the cold cathode 5. The vacuum chamber 1 is first evacuated to between $10^{-4}$ to $10^{-6}$ Torr to remove background gas and is then selectively filled with a chosen gas to 1 Torr or less pressure. The type of gas chosen will aid the electron interaction with bulk films if electron mean free paths in the gas are large compared to cathode-wafer spaces or if the process of electron beam aided chemical reaction occurs. Conventional low inductance, fast current pulse electrical design rules dictate that the anode ring 6 is connected to ground potential which is also the other terminal of the high voltage pulse source 9. The X-Y-Z-theta stage 13 is also connected to ground potential for safety reasons. The high voltage pulse source 9 is then switched on. The region between the cold cathode 5 and the anode 6 breaks down electrically, a plasma occurs and an electron beam discharge is formed. The electrons produced in the electron beam discharge pass through the openings in metal wire mesh 14 and are deposited on the patterned resist layer. The energetic beam electrons penetrate the resist and initiate the hardening process called cross-linking. Hence, resists which cross-link on electron irradiation are typical candidate materials for the process of the present invention. Both the intensity variation of electrons emitted from the cold cathode 5 and the non-electron transmitting regions of the metal wire mesh 14 contribute to non-uniformity of the hardening process. Hence, to harden resist layers more uniformly, the substrate 12 with the patterned resist layer thereon is rotated about the center of symmetry 15, as well as well as being translated during electron illumination, so as to obtain uniform electron illumination and hence uniform hardening.

Following is a description of a photoresist/polymer resist hardening or stabilizing process which uses a short duration, pulsed electron beam of wide area produced by an abnormal glow discharge in soft vacuum.

Figure 3:
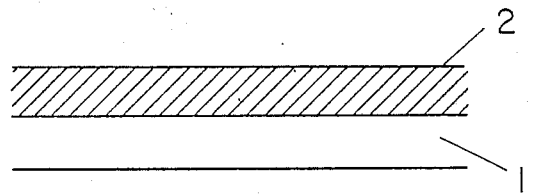
FIG. 3 is a schematic representation of the photoresist/polymer resist film coating and soft curing process using any one of several prior art methods.

In FIG. 3, a wide area substrate 1 has formed thereon a photoresist/polymer resist layer 2 by a conventional film forming process such as spin coating or dip coating. The deposited film is then cured at a set temperature and for a suitable length of time so as to drive away the solvent. This conventional cure time-temperature process depends on the type of photoresist/polymer resist chosen, its viscosity, its thickness, and other process parameters.

Figure 4:
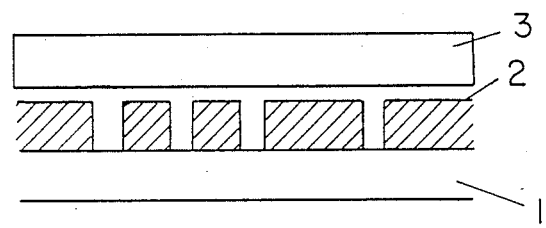
FIG. 4 is a schematic representation of the pattern forming process using any one of several prior art methods.

In FIG. 4, the relief pattern formation in the photoresist/polymer resist layer is shown. The pattern formation process uses a conventional lithographic tool 3. The lithographic tool 3 is based on any one of several techniques which include photolithography, ion beam lithography, electron beam lithography, and X-ray lithography. One such variant of an electron beam process is a soft vacuum electron beam patterning process as disclosed in pending U.S. patent application Ser. No. 856,950 filed Apr. 28, 1986. The photoresist/polymer resist patterning process is followed by a conventional development process leading to either positive tone patterns or negative tone patterns formed on the photoresist/polymer resist layer.

Figure 5:
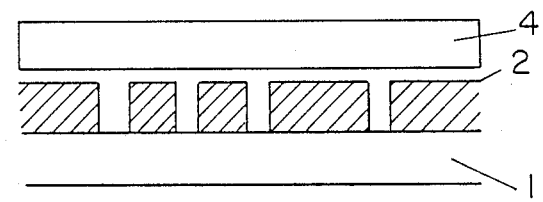
FIG. 5 is a schematic representation of the photoresist/polymer resist hardening process of the present invention.

In FIG. 5, the patterned photoresist/polymer resist layers obtained from the conventional process illustrated in FIG. 4 is exposed to a hardening tool 4. The hardening or stabilizing tool 4 may use any one of several techniques, which include ultraviolet and deep ultraviolet hardening, the PRIST process, ion beam hardening, and conventional thermionic electron beam hardening. The present invention specifically stipulates the use of a short duration pulsed electron beam of wide area produced in soft vacuum. The soft vacuum electron beam needed for hardening may conveniently be produced in an apparatus such as that described in pending U.S. patent application Ser. No. 856,950. The manner of producing the short duration pulsed electron beam and the preferred specifications of the electron beam required in the present hardening process are described below.

An abnormal glow discharge is established between the front face of a cold cathode electron gun and an annular anode. The vacuum enclosure in which the abnormal glow discharge occurs may be evacuated to between $10^{-4}$ and $10^{-6}$ Torr and can be back filled to a pressure between 1 to $10^{-3}$ Torr with a suitable gas including helium, hydrogen, synthetic air, and mixtures thereof. The abnormal glow discharge is capable of being repetitively pulsed, and during each such pulse the electric current in the discharge may rise from an initial low level to a final high level and return to the initial level at the termination of the pulse. The preferred duration of such a discharge being less than 1 microsecond and the pulse energy expended in the discharge being at least 0.1 Joule. The initial current level may be established by a conventional low current discharge. Typically few microns thickness of a photoresist/polymer such as, for example, AZ-2400 resist placed 8 centimeters from the cold cathode can be efficiently hardened by 50 to 150 pulses of 25 kilovolt electrons produced in 30 millitorr of synthetic air. The typical discharge energy per pulse under the above conditions is 2–3 Joules. Fewer pulses are required for closer substrate-to-cathode spacings or higher energy pulses. To harden patterns made on polyamic acid of thickness similar to the above requires 150–200 pulses. Hence, the number of pulses needed would also depend on the type of resist. As described above, the energy of the impinging electron determines the thickness of resist it can uniformly harden. Since the hardening process of the present invention takes place in a gaseous ambient, the hardening process would also be influenced by the ambient gas because of both thermal as well as chemical processes induced by the impinging electron beam.

Figure 6:
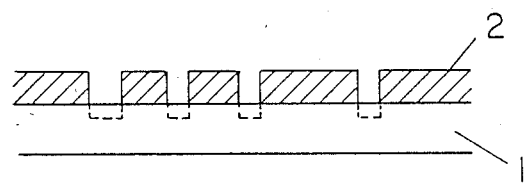
FIG. 6 is a schematic representation of the subsequent high temperature process that usually follows the photoresist/polymer resist hardening process of the prior art.

The process illustrated in FIG. 6 is any one of several conventional high temperature processes, such as lift-off, ion implantation, reactive ion etching, hard baking, etc. Had it not been for the hardening/stabilizing process carried out in the process described in FIG. 5, the photoresist/polymer resist pattern would flow in an undesired manner during this high temperature process and the geometric pattern on the photoresist/polymer resist layer becomes distorted, with the subsequent loss of originally intended geometrical dimensions.

Among the materials suitable for this resist layer shown in FIG. 3 are Novolac type photoresists such as AZ-2400, polyimides of various formulations including those formed by percursor polyamic acid, Microresist 700 series of Eastman Kodak, chloromethylated polystyrenes, MacDermid HPR resists, as well as any electron cross-linkable resist made from polysilanes, organosilanes or metal polymers. In some cases, the resist layer may consist of a plurality of sublayers of differing chemical compositions, including organic and inorganic formulations. Preferred thickness range for the material is from 0.5 um. to 15 um.

In accordance with the hardening process of the present invention, the wide area electron beam is produced under soft vacuum conditions. This vacuum region is ideal for producing the high pumping speeds required for resist/polymer hardening economically. This is important because the vapors outgassing from the wide area resist layer can be pumped away rapidly and their harmful effect on the cold cathode 5 is minimal, especially as compared to the deleterious effects on a hot filament electron emitter which must operate in high vacuum. The pulsed mode of operation is ideal for producing large electron currents as well as for assisting vapor removal between electron beam current pulses. The energy requirement for the present soft vacuum electron beam hardening process, as compared to the prior art ultraviolet lamp hardening process, is smaller and the required processing time per wafer is shorter.

We claim:

1. A resist hardening process for hardening a previously patterned resist layer on a substrate, the process comprising:
   positioning a substrate having a previously patterned resist layer thereon in a vacuum chamber;
   evacuating the vacuum chamber with a selected gas to a selected pressure level;
   producing a wide area pulsed abnormal glow electron beam discharge from a cold cathode abnormal glow discharge electron gun positioned within the vacuum chamber, said pulsed abnormal glow electron beam discharge being pulsed from a first current level to a higher second current level; and
   exposing the previously patterned resist layer on the substrate to the wide area pulsed abnormal glow electron beam discharge for a predetermined number of pulses.

2. A resist hardening process for hardening a previously patterned resist layer on a substrate as in claim 1 wherein said selected gas comprises helium.

3. A resist hardening process for hardening a previously patterned resist layer on a substrate as in claim 1 wherein said selected gas comprises hydrogen.

4. A resist hardening process for hardening a previously patterned resist layer on a substrate as in claim 1 wherein said selected gas comprises synthetic air.

5. A resist hardening process for hardening a previously patterned resist layer on a substrate as in claim 1 wherein said selected gas comprises a mixture of hydrogen and synthetic air.

6. A resist hardening process for hardening a previously patterned resist layer on a substrate as in claim 1 wherein said selected gas comprises a mixture of helium and synthetic air.

7. A resist hardening process for hardening a previously patterned resist layer on a substrate as in claim 1 wherein said first pressure level is within the range of $10^{-4}$ to $10^{-6}$ Torr and wherein said second pressure level is within the range of 1.0 to $10^{-3}$ Torr.

8. A resist hardening process for hardening a previously patterned resist layer on a substrate as in claim 1 wherein each pulse of said wide area glow discharge electron beam discharge has a duration of less than 1 microsecond.

9. A resist hardening process for hardening a previously patterned resist layer on a substrate as in claim 8 where each pulse of said wide area glow discharge electron beam discharge has an energy level greater than 0.1 joule.

10. A resist hardening process for hardening a previously patterned resist layer on a substrate as in claim 1 wherein said patterned resist layer comprises an organic material.

11. A resist hardening process for hardening a previously patterned resist layer on a substrate as in claim 1 wherein said patterned resist layer comprises a copolymer material.

12. A resist hardening process for hardening a previously patterned resist layer on a substrate as in claim 1 wherein said patterned resist layer comprises a polymer material and one or more inorganic materials.

13. A resist hardening process for hardening a previously patterned resist layer on a substrate as in claim 1 wherein said patterned resist layer comprises an organosilicon material.

14. A resist hardening process for hardening a previously patterned resist layer on a substrate as in claim 1 wherein said patterned resist layer comprises an organometallic material.

15. A resist hardening process for hardening a previously patterned resist layer on a substrate as in claim 1 wherein said patterned resist layer comprises a polysilane material.

16. A resist hardening process for hardening a previously patterned resist layer on a substrate as in claim 1 wherein said patterned resist layer comprises a polymer material directly doped with a metal compound.

17. A resist hardening process for hardening a previously patterned resist layer on a substrate as in claim 1 wherein said patterned resist layer comprises a top layer of a plurality of layers.

* * * * *

UNITED STATES PATENT AND TRADEMARK OFFICE
CERTIFICATE OF CORRECTION

PATENT NO. : 4,904,866

DATED : February 27, 1990

INVENTOR(S) : George J. Collins et al.

It is certified that error appears in the above-identified patent and that said Letters Patent is hereby corrected as shown below:

Claim 1 should read as follows:

1. A resist hardening process for hardening a previously patterned resist layer on a substrate, the process comprising:

positioning a substrate having a previously patterned resist layer thereon in a vacuum chamber;

evacuating the vacuum chamber to a first pressure level;

backfilling the vacuum chamber with a selected gas to a second pressure level;

producing a wide area pulsed abnormal glow electron beam discharge from a cold cathode abnormal glow discharge electron gun positioned within the vacuum chamber, said pulsed abnormal glow electron beam discharge being pulsed from a first current level to a higher second current level; and

UNITED STATES PATENT AND TRADEMARK OFFICE
CERTIFICATE OF CORRECTION

PATENT NO. : 4,904,866

DATED : February 27, 1990

INVENTOR(S) : George J. Collins et al.

It is certified that error appears in the above-identified patent and that said Letters Patent is hereby corrected as shown below:

exposing the previously patterned resist layer on the substrate to the wide area pulsed abnormal glow electron beam discharge for a predetermined number of pulses.

Signed and Sealed this

Twenty-third Day of July, 1991

Attest:

HARRY F. MANBECK, JR.

*Attesting Officer*  *Commissioner of Patents and Trademarks*